US006469564B1

(12) United States Patent
Jansen (10) Patent No.: US 6,469,564 B1
(45) Date of Patent: Oct. 22, 2002

(54) CIRCUIT SIMULATING A DIODE

(75) Inventor: Arian M. Jansen, Thousand Oaks, CA (US)

(73) Assignee: Minebea Co., Ltd., Tokyo (JP)

(*) Notice: Subject to any disclaimer, the term of this patent is extended or adjusted under 35 U.S.C. 154(b) by 0 days.

(21) Appl. No.: 09/567,590

(22) Filed: May 9, 2000

Related U.S. Application Data (63) Continuation-in-part of application No. 09/059,968, filed on Apr. 14, 1998, now Pat. No. 6,060,943.

(51) Int. Cl.[7] .............................................. H03K 17/00
(52) U.S. Cl. ...................... 327/365; 327/368; 327/387
(58) Field of Search ................................ 327/538, 540, 327/541, 543, 427, 493, 365, 374, 376, 377, 387, 368

(56) References Cited

U.S. PATENT DOCUMENTS

| | | | | |
|---|---|---|---|---|
| 3,916,220 A | | 10/1975 | Roveti ........................ 361/98 |
| 4,417,164 A | | 11/1983 | Edlund ........................ 327/603 |
| 4,678,947 A | * | 7/1987 | Huijsing et al. ............... 327/50 |
| 5,210,503 A | | 5/1993 | Sawamura ................... 330/110 |
| 5,404,053 A | | 4/1995 | Poma et al. ................. 327/108 |
| 5,473,238 A | | 12/1995 | Latham, II et al. .......... 318/560 |
| 5,506,527 A | * | 4/1996 | Rudolph et al. ............. 327/104 |
| 5,517,379 A | | 5/1996 | Williams et al. .............. 361/84 |
| 5,519,557 A | | 5/1996 | Kopera, Jr. et al. ........... 361/84 |
| 5,539,610 A | | 7/1996 | Williams et al. ............. 361/246 |
| 5,716,725 A | | 2/1998 | Riveron et al. ................. 429/1 |
| 5,736,890 A | * | 4/1998 | Yee et al. .................... 327/423 |
| 5,744,878 A | * | 4/1998 | Wachter et al. .............. 307/130 |
| 5,828,204 A | * | 10/1998 | Jansen ........................ 323/266 |
| 6,060,943 A | * | 5/2000 | Jansen ........................ 327/543 |

OTHER PUBLICATIONS

S. Clemente, "An Introduction to International Rectifier P. Channel HEXFETs", HexFet Power MOSFET Designer's Manual, vol. 1, pp. 27–28 (1993).
Paul Horowitz, "Field–Effect Transistor Fet Charateristics", The Art of Electronics, pp. 224–227, 1985, Mass, U.S.A.
Robert Boylestad and Louis Nashelsky, "Electronic Devices and Circuit Theory", Third Edition, pp. 199–203, 1982, NJ, USA.

* cited by examiner

Primary Examiner—Timothy P. Callahan
Assistant Examiner—Hai L. Nguyen
(74) Attorney, Agent, or Firm—Schulte Roth & Zabel LLP; Joel E. Lutzker; Donna L. Angotti (57) ABSTRACT

A circuit simulating the function of a diode in the sense that it conducts current in one direction and blocks current in the opposite direction, but which has a low forward voltage drop. A voltage comparator and a three terminal switch are connected so that the intrinsic reverse diode associated with the switch is harnessed to conduct current in the direction in which it is desired to conduct current and to block current in the direction in which it is desired to block current. A voltage comparator controls the control terminal of the three terminal switch to turn on the switch to conduct current and to interrupt current. Alternate embodiments of voltage comparators are disclosed. The voltage comparator may include charging and discharging transistors so that the switch turns on and off at a high speed. The invention further includes a method of conducting current in one direction and blocking current in a second direction which reduces power losses.

10 Claims, 7 Drawing Sheets

CIRCUIT SIMULATING A DIODE

This application is a continuation-in-part of application Ser. No. 09/059,968 filed Apr. 14, 1998, now U.S. Pat. No. 6,060,943 by the same inventor.

FIELD OF THE INVENTION

This invention relates to a circuit which behaves like a diode in the sense that it conducts current in one direction and blocks current in the opposite direction. More specifically, the invention relates to a circuit simulating a diode without disadvantages of an actual diode.

BACKGROUND OF THE INVENTION

Conventional p–n junction diodes and Schottky barrier diodes are associated with a forward voltage threshold. More particularly, an ideal diode would conduct a current in one direction without power loss and would block a current in the opposite direction. However, a practical (real) diode conducts a current in the forward direction, but only after a certain threshold voltage is reached. Furthermore, due to the internal resistance of an actual diode, an additional voltage drop occurs depending on the values of the internal resistance and the current. The sum of the threshold voltage and the voltage drop caused by the internal resistance is referred to as a forward voltage drop (Vf) of a diode.

In circuits having high forward currents, like power rectifiers and OR-ing diodes in redundant power supplies, the power loss can be very high and has a significant impact on the efficiency of the circuit. Therefore, there is a need for a circuit which simulates the function of a diode in that it conducts current in one direction and blocks current in the opposite direction, but has a low forward voltage drop Vf in order to reduce power loss in circuits. In OR-ing diodes in redundant power supply systems, the diode must switch off fast to avoid short reverse current spikes if one power supply breaks down. However, there is no need for this diode to switch on very fast. There is a need for a circuit that simulates a diode that switches on as well as off fast, i.e. at speeds as high as a few hundred kilohertz, for use in other applications such as for use as a rectifier in switch-mode power supplies.

Figure 1A:
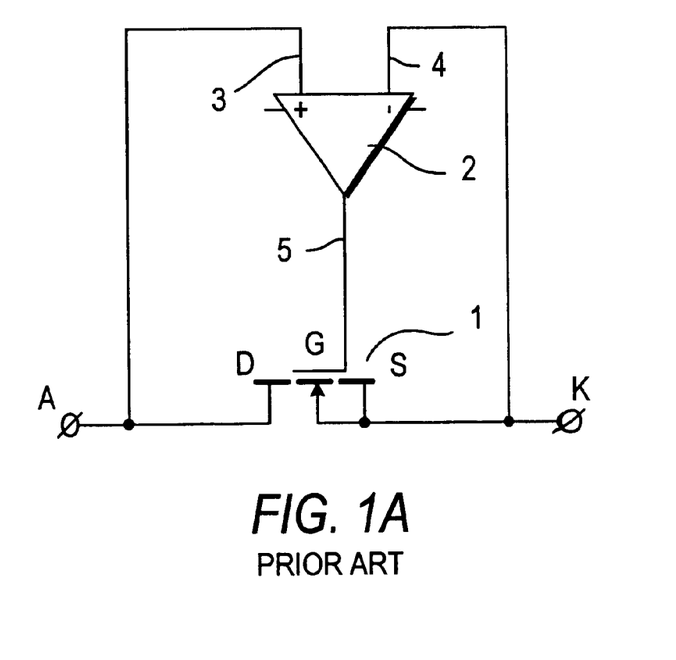
FIG. 1A is an electrical model of a unidirectional mechanical device employing a simulation for a diode in accordance with the prior art.

Edlund, in U.S. Pat. No. 4,417,164 issued Nov. 22, 1983 discloses an electrical model for a unidirectional mechanical valve. Edlund notes that the properties of an actual diode for use in such a model has major drawbacks which differ from an ideal diode such as the presence of a voltage drop across the diode when it is conducting current. Further, an actual diode will not begin to conduct current until the voltage difference between the anode and the cathode reaches a turn-on voltage of about 0.5 volts. Additionally, a diode does not change from a non-conducting to a conducting state immediately, but rather has a finite switching speed which depends in part on the rate of the change of the voltage across the diode. A diode is adversely effected by the junction capacitance between the anode and the cathode. Accordingly, Edlund discloses a circuit as shown in FIG. 1A incorporating a field effect transistor (n-channel enhancement MOSFET) 1 with drain and source terminals connected to input and output terminals A and K, respectively, as shown. A voltage comparator 2 has positive input 3 and negative input 4 connected to the drain and source terminals of the MOSFET 1, respectively, as shown. The comparator output 5 is coupled to the gate of the MOSFET 1. The power supply for the voltage comparator is floating so that the device is unaffected by the remainder of the electrical system.

It is known that in an n-channel device, the conventional flow of drain current is in the positive direction—that is, current flows from the drain to the source with a positive gate-to-source voltage. Typically the drain is connected to a higher voltage than the source. Further, it is known that an n-channel device has an integral reverse rectifier associated therewith. This intrinsic diode is an integral part of the device and is not a separate electrical component. In an n-channel device, the intrinsic diode effectively has an anode connected to the source and a cathode connected to the drain.

Figure 1B:
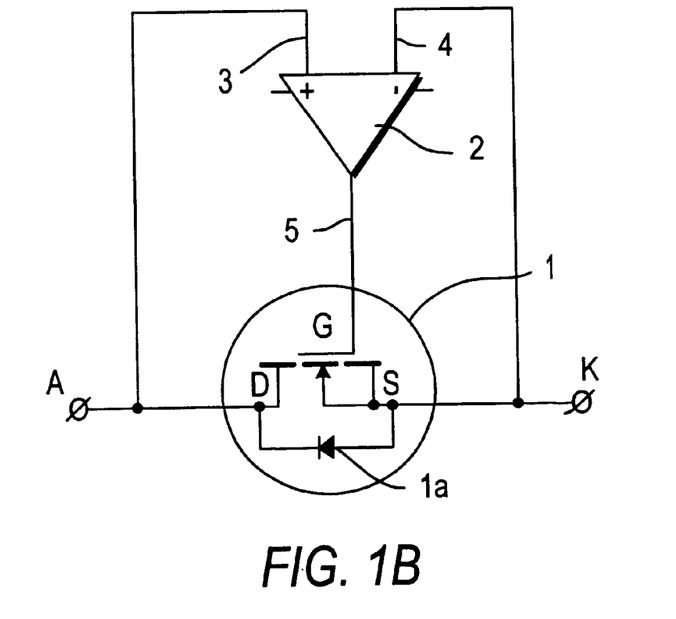
FIG. 1B is a diagram showing an intrinsic diode associated with a MOSFET for analysis of the circuit of FIG. 1A.

FIG. 1B is provided by the Applicant for a patent for the present invention for analysis of the actual operation of the prior art circuit of FIG. 1A and shows n-channel enhancement MOSFET 1 having an intrinsic diode 1a with its anode connected to the source and its cathode connected to the drain. The intrinsic diode 1a is enclosed within a circle with the symbol for the MOSFET to indicate that the intrinsic diode 1a is part of the MOSFET 1 and is not a separate electrical component.

The theoretical operation of Edlund's circuit in FIG. 1A is a follows: when a higher voltage is placed on the drain then on the source, the output 5 of voltage comparator 2 goes high and is input to the gate of the MOSFET 1. Accordingly, the MOSFET 1 is controlled to conduct current from the terminal A at a higher voltage to the terminal K at a lower voltage. On the other hand, theoretically, during operation, when the terminal K is placed at a higher voltage than the terminal A, the output 5 of voltage comparator 2 goes low and is input to the gate of the MOSFET 1 in order to control the MOSFET to stop conducting current. Theoretically, the MOSFET 1 will conduct current from terminal A to terminal K when terminal A is at a higher voltage than terminal K. Further, theoretically, in operation, the MOSFET 1 will not conduct current from terminal K to terminal A when terminal K is at a higher voltage than terminal A. Accordingly, theoretically, Edlund's circuit simulates the action of a diode.

In actuality, however, the Applicant for a patent for the present invention has identified a problem in the prior art: when Edlund's circuit is actually constructed employing an actual MOSFET 1, it fails. FIG. 1B is provided to analyze the actual operation of the prior art circuit of FIG. 1A. More particularly, when the voltage at terminal A is higher than the voltage at terminal K, the output 5 of the voltage comparator 2 goes high and is input to the gate of the MOSFET 1. The gate controls the MOSFET to conduct current from terminal A to terminal K. On the other hand, when the voltage at terminal K is higher than the voltage at terminal A, the voltage comparator 2 delivers a low output voltage 5 which is input to the gate of the MOSFET 1 in order to control the MOSFET 1 to stop conducting current and block current from terminal K to terminal A. Due to the integral reverse intrinsic diode 1a of the MOSFET 1, the MOSFET 1, in practice, actually conducts current from the high voltage at terminal K to the low voltage at terminal A. Accordingly, Edlund's circuit shown in FIG. 1A does not actually operate to simulate the function of a diode because it does not take into consideration the effect of the intrinsic diode 1a of the MOSFET 1 as identified by the Applicant for patent for the present invention.

Accordingly, there is still a need for a circuit that functions like a diode in that it conducts current in one direction and blocks current in the opposite direction, however, has a low forward voltage drop. There is also a need for a circuit that functions like a diode in that is conducts current in one direction and blocks current in the opposite direction that reduces power losses. There is further a need for a circuit that functions like a diode that switches on and off at high speeds.

SUMMARY OF THE INVENTION

It is an object of the invention to provide a circuit which functions like a conventional diode in that it conducts current in one direction and blocks current in the opposite direction.

A further object of the invention is to provide a circuit that simulates the function of a diode that has a low forward voltage drop.

It is a further object of the invention to provide a circuit that functions like a diode, but eliminates the threshold voltage of the forward voltage drop of a conventional diode.

It is still a further object of the invention to provide a circuit that functions as a diode that detects if the circuit is malfunctioning.

Additionally, it is an object of the invention to provide a circuit that functions as a diode that provides an indication of malfunctioning.

It is another object of the invention to provide a circuit that conducts current in one direction and blocks current in the opposite direction that does not have a threshold voltage.

It is an additional object of the invention to provide a circuit that conducts current in one direction and blocks current in the opposite direction that reduces power losses.

It is still another object of the invention to provide a circuit which functions as a diode which switches on and off fast.

It is yet another object of the invention to provide a circuit that functions as a diode that switches on and off at speeds as high as a few hundred kilohertz.

It is a further object of the invention to provide a circuit that functions as a diode for use as a rectifier in switch-mode power supplies.

These and other objects of the invention are accomplished by providing a circuit for improving the switching performance of a three terminal switch comprising the three terminal switch having a source for electrons, a drain for electrons, and a control terminal having an internal capacitance between the control terminal and the source for electrons; and means for amplifying the current for modifying the charged state of said internal capacitance.

In a preferred embodiment, there is provided the means for amplifying the current comprising a transistor.

In another preferred embodiment, there is provided a circuit with two terminals A and K, which conducts current in one direction from terminal A to terminal K and blocks current in the opposite direction from terminal K to terminal A, comprising a voltage comparator, having a positive input, a negative input, and an output; and a three terminal means for switching current with a source for electrons, a drain for electrons, and a control terminal controlled by a voltage from the output of the voltage comparator; the three terminal switching means having an internal capacitance between the control terminal and the source for electrons associated therewith; and wherein the voltage comparator negates the effects on switching time of the switching means due to the internal capacitance.

The invention further contemplates a voltage comparator comprising means for amplifying the current in order to negate the effects on switching time of the switching means due to the internal capacitance. Additionally, the invention employs means for amplifying the current comprising a transistor.

Also disclosed is a method of conducting current in one direction from a terminal A to a terminal K and blocking current in a second direction from terminal K to terminal A, comprising: (a) comparing a voltage signal at a positive input of a comparator to a voltage signal at a negative input of the comparator to obtain an output voltage; (b) connecting a three terminal switch between terminal A and terminal K, wherein the three terminal switch has an internal resistance associated therewith, an intrinsic diode associated therewith, and a source for electrons, a drain for electrons and a control terminal; (c) connecting the output voltage to the control terminal of the three terminal switch; (d) connecting an effective anode of the intrinsic diode to terminal A; (e) connecting an effective cathode of the intrinsic diode to terminal K; and (f) inputting voltage signals to the comparator by connecting the source of the three terminal switch to the positive input of the comparator, and connecting the drain of the three terminal switch to the negative input of the comparator.

The above and other objects, aspects, features and advantages of the invention will be more readily apparent from the description of the preferred embodiments thereof taken into conjunction with the accompanying drawings and appended claims.

BRIEF DESCRIPTION OF THE DRAWINGS

The invention is illustrated by way of example and not limitation in the figures of the accompanying drawings in which like references denote like or corresponding parts and in which.

DESCRIPTION OF THE PREFERRED EMBODIMENTS

Figure 2:
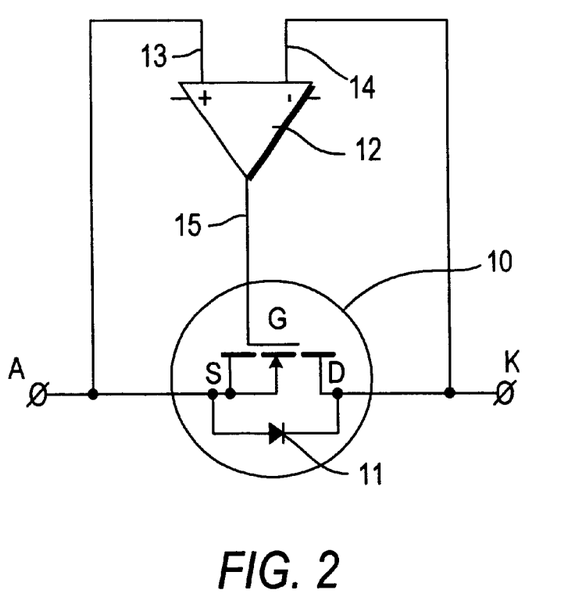
FIG. 2 is a circuit simulating a diode in accordance with the invention employing an n-channel enhancement MOSFET.

Referring to FIG. 2, a circuit that functions like a diode in that it conducts current in one direction from terminal A to terminal K and blocks current in the opposite direction from terminal K to terminal A, but has a low forward voltage drop is shown in accordance with the first embodiment of the invention. The circuit which conducts current in one direction from terminal A to terminal K and blocks current in the opposite direction from terminal K to terminal A includes a three terminal switching means 10 for switching current with a source for electrons S, a drain for electrons D, and a control terminal G. Further, the three terminal switching means 10 has an internal resistance associated with it and an intrinsic diode associated with it between the source and the drain. The intrinsic diode 11 is shown encompassed within a circle with the symbol for a MOSFET to indicate that the intrinsic diode 11 is part of the three terminal switching means 10 rather than a separate electrical component. The switching means 10 is connected between the terminals A and K.

The circuit of FIG. 2 further includes a voltage comparator 12 having a positive input 13, a negative input 14 and an output 15. The output 15 is connected to the control terminal G of the three terminal switching means 10. The source S of the three terminal switching means is connected to the positive input 13 of the voltage comparator 12 and the drain D of the three terminal switching means 10 is connected to the negative input 14 of the voltage comparator 12. The intrinsic diode 11 has an effective anode connected to terminal A and an effective cathode connected to terminal K. Accordingly, in operation, the intrinsic diode 11 enhances conduction from terminal A to terminal K and blocks conduction of current from terminal K to terminal A. The internal diode 11 of the three terminal switching means operates to enhance the function of the entire circuit to conduct current in one direction from terminal A to terminal K and to block current in the opposite direction. Accordingly, the intrinsic diode 11 internal to the three terminal switching means 10 is employed as a circuit element to enhance operation of the whole circuit rather than as in unfortunate side effect of a switch that degrades the operation of the circuit as in Edlund's prior art circuit of FIG. 1A.

In FIG. 2 the three terminal switching means is an n-channel enhancement mode MOSFET. Accordingly, the intrinsic diode 11 has an effective anode connected to the source and an effective cathode connected to the drain. As stated previously, the source is connected to terminal A and the drain is connected to terminal K. Further, the source is connected to the positive input 13 of the voltage comparator 12 and the drain is connected to the negative input 14 of the voltage comparator 12.

In operation, employing an actual n-channel enhancement MOSFET, the circuit of FIG. 2 functions as follows: when a higher voltage is at terminal A than at terminal K, the output 15 of voltage comparator 12 goes high turning the MOSFET 10 on to conduct current from the high voltage at the source to the low voltage at the drain. Accordingly, current flows from terminal A to terminal K. An n-channel enhancement MOSFET will conduct current from the source to the drain, even though typically an n-channel enhancement MOSFET is used in circuits to conduct current from the drain to the source.

However, when a higher voltage is at terminal K when compared to the voltage at terminal A, the output 15 of voltage comparator 12 goes low and is input to the gate of the MOSFET 10 to turn off the current from terminal K to terminal A. The intrinsic diode 11 assists in the operation of the MOSFET 10 by blocking current flow from terminal K to terminal A because the cathode of the intrinsic diode 11 is connected to terminal K and the anode of the intrinsic diode 11 is connected to terminal A. Accordingly, the circuit of FIG. 2 functions as a diode in that it conducts current from terminal A to terminal K and blocks current from terminal K to terminal A. The intrinsic diode 11 of the MOSFET 10 enhances the operation of the entire circuit rather than undermining the operation of the circuit as in Edlund's prior art circuit of FIG. 1A. Further, the threshold voltage of an actual diode is eliminated and the forward voltage drop is lower than that for a traditional diode and depends upon the values of the internal resistance associated with the three terminal switching means 10 and the current through the three terminal switching means 10.

The circuit of FIG. 2 may be modified to employ an n-channel depletion MOSFET rather than the illustrated n-channel enhancement MOSFET 10. Operation of the circuit is essentially the same.

Figure 3:
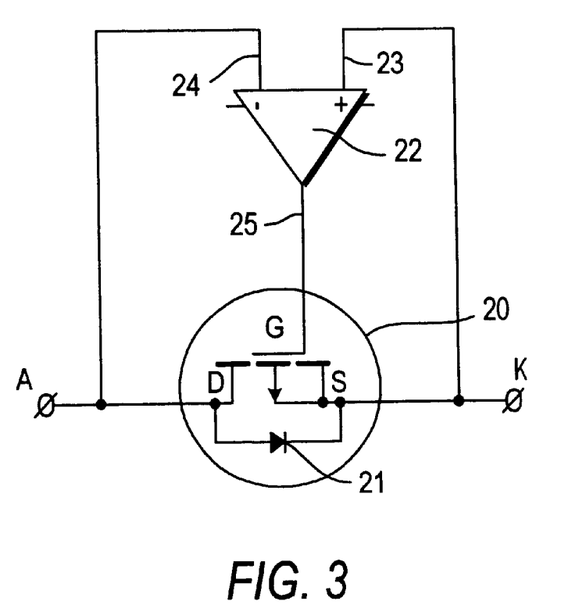
FIG. 3 is a circuit simulating a diode in accordance with another embodiment of the invention employing a p-channel enhancement MOSFET.

FIG. 3 is a second embodiment of the invention employing a p-channel enhancement mode MOSFET rather than the n-channel enhancement mode MOSFET of FIG. 2.

The circuit of FIG. 3 includes a voltage comparator 22 having a positive input 23 and a negative input 24 and an output 25. The output 25 is connected to the control terminal G of the three terminal switching means 20. The source S of the three terminal switching means is connected to the positive input 23 of the voltage comparator 22 and the drain D of the three terminal switching means 20 is connected to the negative input 24 of the voltage comparator 22. The intrinsic diode 21 of the switching means 20 has an effective anode connected to terminal A and an effective cathode connected to terminal K. Accordingly, in operation, the intrinsic diode 21 enhances conduction from terminal A to terminal K and blocks conduction of current from terminal K to terminal A. The internal diode 21 of the three terminal switching means 20 operates to enhance the function of the entire circuit to conduct current in one direction from terminal A to terminal K and to block current in the opposite direction. Accordingly the intrinsic diode 21 internal to the three terminal switching means 20 is employed as a circuit element to enhance operation of the circuit rather than as in unfortunate side effect of a switch that degrades the operation of the circuit as in Edlund's prior art circuit of FIG. 1A.

In FIG. 3 the three terminal switching means 20 is a p-channel enhancement mode MOSFET. Accordingly, the intrinsic diode 21 has an effective anode connected to the drain and an effective cathode connected to the source. The drain is connected to terminal A and the source is connected to terminal K. Further, the source is connected to the positive input 23 of the voltage comparator 22 and the drain is connected to the negative input 24 of the voltage comparator 22.

In operation, employing an actual p-channel enhancement MOSFET, the circuit of FIG. 3 functions as follows: when a higher voltage is at terminal A than at terminal K, the output 25 of voltage comparator 22 goes low turning the MOSFET 20 on to conduct current from the high voltage at the drain to the low voltage at the source. Accordingly, current flows from the terminal A to terminal K. A p-channel enhancement MOSFET will conduct current from the drain to the source, even though typically a p-channel enhancement MOSFET is used in circuits to conduct current from the source to the drain.

However, when a higher voltage is at terminal K when compared to the voltage at terminal A, the output 25 of voltage comparator 22 goes high and is input to the control terminal G of the MOSFET 20 to turn off the current from terminal K to terminal A. The intrinsic diode 21 assists in the operation of the MOSFET 20 by blocking current flow from terminal K to terminal A because the cathode of the intrinsic diode 21 is connected to terminal K and the anode of the intrinsic diode 21 is connected to terminal A. Accordingly, the circuit of FIG. 3 functions as a diode in that it conducts current from terminal A to terminal K and blocks current from terminal K to terminal A. The intrinsic diode 21 of the MOSFET 20 enhances the operation of the entire circuit of FIG. 3 rather than undermining the operation of the circuit as in Edlund's prior art circuit of FIG. 1A. Further, the threshold voltage of an actual diode is eliminated and the forward voltage drop is lower than that for a traditional diode and depends upon the values of the internal resistance associated with the three terminal switching means 20 and the current through the three terminal switching means 20. The circuit of FIG. 3 may be modified to employ a p-channel depletion MOSFET rather than the illustrated p-channel enhancement MOSFET 20. Operation of the circuit is essentially the same.

In FIG. 3 the p-channel MOSFET 20 is again connected to the terminals A and K and to the positive and negative inputs 22 and 23, respectively, of the comparator 24, such that the intrinsic diode 21 is harnessed to enhance the operation of the circuit of FIG. 3 rather than operating as an unfortunate side effect that undermines the operation of the circuit.

Figure 4:
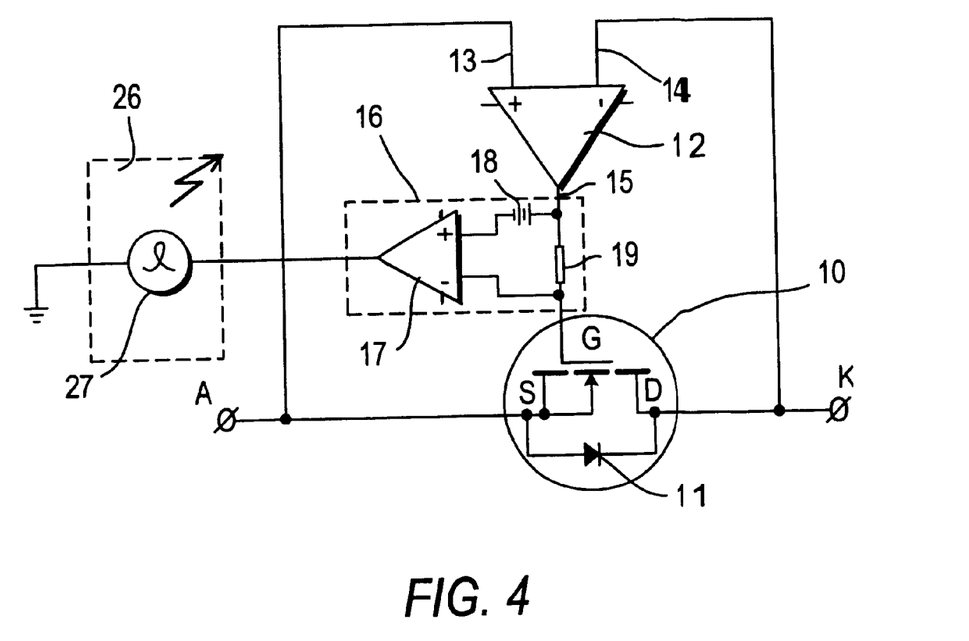
FIG. 4 is the circuit of FIG. 2 with malfunction detection means and a malfunction indicator added in accordance with another embodiment of the invention.

FIG. 4 shows another embodiment of the invention wherein the circuit of FIG. 2 employing an n-channel enhancement MOSFET is modified to include a detection means 16 for detecting if the three terminal switching means 10 is malfunctioning. The three terminal switching means 10 of FIGS. 2 and 4 includes a control terminal (the gate G) which is isolated from the channel so that the switching device can be operated with the effect that a gate voltage will create or control the channel and thereby reduce the width of the channel to increase or decrease the drain-source resistance resulting in a change in the drain current with no gate current. Accordingly, the existence of a gate current (any current at a control terminal of a three terminal switching means) indicates that the three terminal switching means is malfunctioning. The detection means 16 for detecting if the three terminal switching means 10 is malfunctioning shown in FIG. 4 determines if there is a gate current. If a gate current exists, the output of the detection means 16 goes high, the high voltage is input to an indicator device 26 which indicates that the three terminal switching means 10 is malfunctioning. The indicator device 26 may be a lamp or other visible or audible indicating device such as an LED.

The detection means 16 for detecting if the three terminal switching means 10 is malfunctioning includes a comparator 17 having a positive input and a negative input, a threshold voltage generator 18 having a positive terminal and a negative terminal and a resistor 19. The resister 19 has two ends and is connected between the output 15 of the voltage comparator 12 and the control terminal G of the switching means 10. The first end of the resistor 19 is connected to the output 15 of the voltage comparator 12. The other end of the resistor 19 is connected to the control terminal G of the three terminal switching means 10 and to the negative input of the voltage comparator 17. The output of the voltage comparator 15 is further connected to the positive terminal of the threshold voltage generator 18. The negative terminal of the threshold voltage generator 18 is connected to the positive input of the voltage comparator 17.

In operation, if the n-channel enhancement MOSFET 10 is functioning, the gate current is nearly 0 and no voltage will exist across resistor 19. The small threshold voltage generated by generator 18 keeps the output of the comparator 17 at a logic low voltage indicating that the MOSFET 10 is okay. If the MOSFET 10 is malfunctioning, a current will flow at the gate G of MOSFET 10 causing a voltage across the resistor 19. If the voltage exceeds the threshold voltage generated by generator 18, the output of the comparator 17 will be at a logic high voltage, meaning that the MOSFET is malfunctioning. The voltage threshold determines the amount of gate current that causes a defect warning. In practice, the gate current of a malfunctioning MOSFET may be millions of times the gate current of a properly operating MOSFET.

The embodiments of FIG. 2 and FIG. 3 employing depletion MOSFETs may also be modified to include detection means for determining if the MOSFET is malfunctioning in a manner similar to that shown in FIG. 4.

A malfunctioning MOSFET will have a low impedance between the gate and source or a low impedance between the gate and drain. Any detection means to determine such a low impedance may be employed in either the FIG. 2 (n-channel) or FIG. 3 (p-channel) MOSFET embodiments of the invention. For example the detection means 40 shown in FIG. 6 below may be connected between the gate and source of a MOSFET. Similar detection means may be employed for determining if the gate and drain of a MOSFET are short circuited. Similar circuits may be provided for any type of MOSFET (i.e., n or p-channel, enhancement or depletion).

Figure 5A:
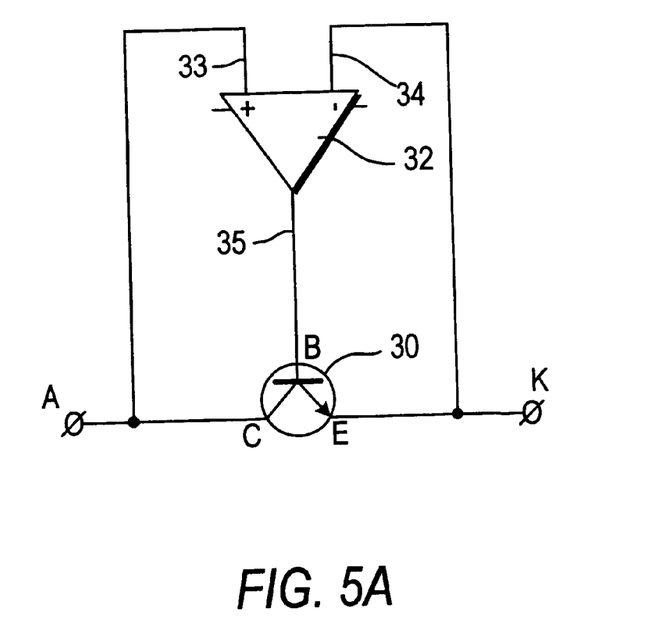
FIG. 5A is a circuit simulating the function of a diode employing an npn bipolar transistor in accordance with another embodiment of the invention.

FIG. 5A illustrates another embodiment of the invention. More particularly, bipolar transistor 30 has a collector C, an emitter E, and a base B. The circuit of FIG. 5A further includes a voltage comparator 32 having a positive input 33, a negative input 33 and an output 35. The collector of the bipolar transistor 30 is connected to the positive input 33 of the voltage comparator 32. The emitter of the bipolar transistor 30 is connected to the negative input 34 of the voltage comparator 32. The base of the bipolar transistor is connected to the output 35 of the voltage comparator 32. The bipolar transistor 30 is connected between the terminals A and K.

In operation, the circuit of FIG. 5A conducts current from terminal A to terminal K when the voltage at terminal A is higher than the voltage at terminal K. Further, the circuit of FIG. 5A blocks the conduction of current from terminal K to terminal A when the voltage at terminal K is higher than the voltage at terminal A. Further, the internal resistance between the collector and the emitter and the current from the collector to the emitter determines the forward voltage drop. Accordingly, a threshold voltage associated with a traditional diode is eliminated and the forward voltage drop is low. In operation, when a small voltage occurs across terminals A and K such that the voltage at terminal A is higher than the voltage at terminal K, comparator 32 will deliver a high output 35 to the base of bipolar transistor 30. Accordingly, the bipolar transistor 30 which is illustrated as an npn transistor, will conduct current from terminal A to terminal K. However, if the voltage at terminal K is greater than the voltage at terminal A, the voltage comparator 32 will deliver a low output 35 at the base of bipolar transistor 30 which interrupts the current flow from terminal K to terminal A. The voltage between terminal K and terminal A due to the internal resistance of the bipolar transistor 30 keeps the bipolar transistor switched off by means of comparator 32.

Figure 5B:
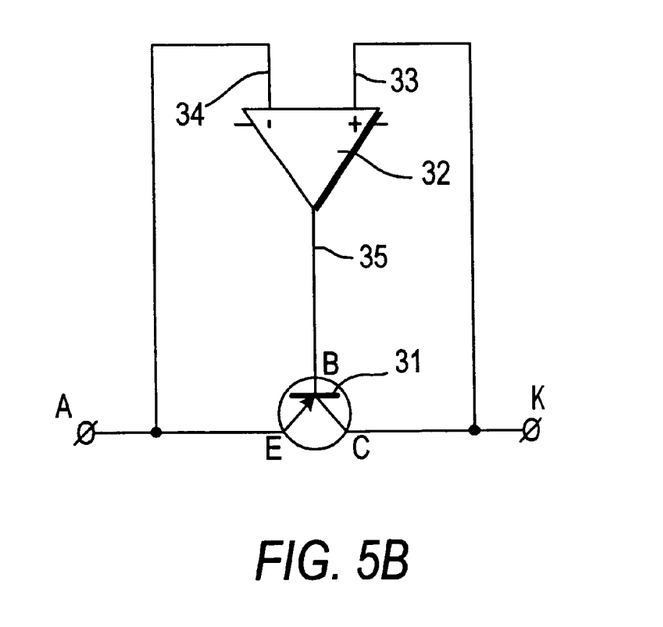
FIG. 5B is a circuit simulating the function of a diode employing a pnp bipolar transistor in accordance with another embodiment of the invention.

FIG. 5B discloses another embodiment of the invention for conducting current in one direction from terminal A to terminal K and blocking current in the opposite direction from terminal K to terminal A with a low forward voltage drop, employing a pnp bipolar transistor. FIG. 5B is similar to FIG. 5A except that npn bipolar transistor 30 has been replaced with pnp bipolar transistor 31. The collector of pnp bipolar transistor 31 is connected to the positive input 33 of the voltage comparator 32 and the emitter of the pnp bipolar transistor 31 is connected to the negative input 34 of the voltage comparator 32.

In operation, when a small voltage occurs across terminal A and terminal K, the comparator 32 switches on the bipolar transistor 31 with a low voltage at the base compared to the voltage at the emitter. The bipolar transistor 31 delivers a collector current to terminal K and the bipolar transistor draws a current from terminal A. The small voltage drop across the collector and emitter keeps the bipolar transistor 31 on by means of the comparator 32. On the other hand, if the other voltage at terminal K is higher than the voltage at terminal A, the voltage comparator 32 delivers a high output 35 to the base of the bipolar transistor 31. The high voltage at the base of bipolar transistor 31 in comparison to the low voltage at terminal A and the emitter causes the bipolar transistor 31 to turn off and there is no conduction of current between terminal K and terminal A. Accordingly, the circuit of FIG. 5B functions as a diode by conducting current from terminal A to terminal K and blocking current from terminal K to terminal A. Further, the threshold voltage between the emitter and collector and current through the transistor determines the forward voltage drop which is less than that for a traditional diode.

Figure 6:
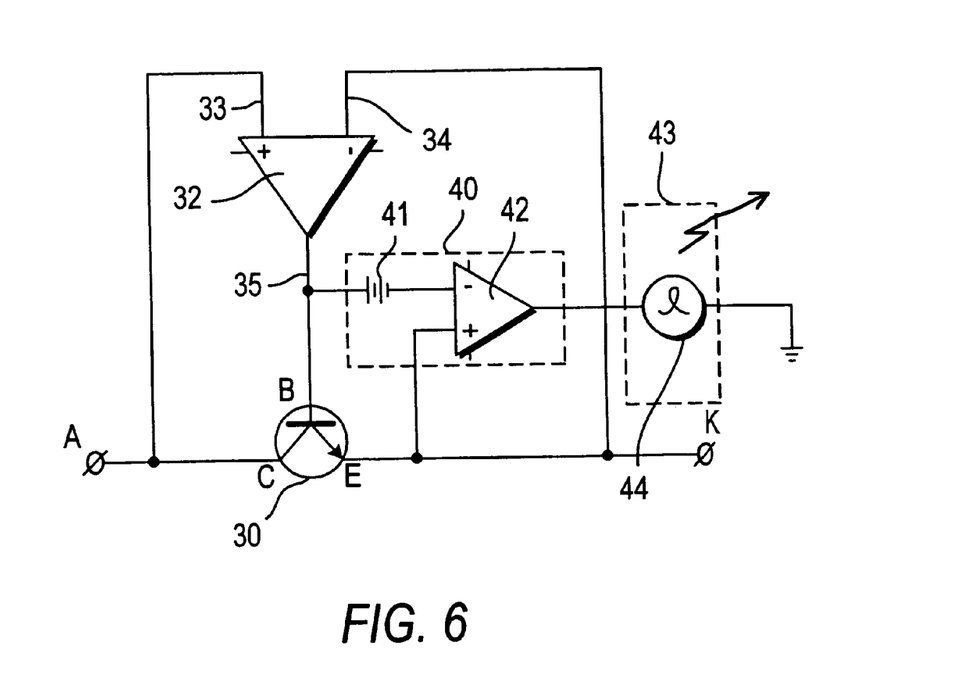
FIG. 6 is the circuit of FIG. 5A with malfunction detection means and a malfunction indicator added in accordance with another embodiment of the invention.

FIG. 6 shows the circuit of FIG. 5A including an npn bipolar transistor 30 modified by adding a detection means 40 for detecting if the bipolar transistor 30 is malfunctioning and an indicator device 43 for indicating a malfunction of the bipolar transistor 30.

A malfunctioning bipolar transistor will have a low impedance between the base and emitter. If a current flows from terminal A to terminal K, a small positive voltage exists between terminal A and K due to the resistance in the current path. Consequently, the output voltage of comparator 32 is a high level. If the bipolar transistor 30 is functioning properly, the voltage between the base and emitter is about 0.7 Volts. The threshold voltage generated by generator 41 of the detection means 40 is slightly below 0.7 Volts and will keep the output of comparator 42 at a low voltage meaning the transistor is okay. If the transistor 30 is malfunctioning, the voltage between the base and emitter will be almost 0. The voltage threshold generated by generator 41 causes the output of comparator 42 to be a high level meaning the transistor is malfunctioning. The threshold voltage generated by generator 41 determines the base emitter voltage which will cause a defect warning. The output of comparator 42 is provided to an indicator device 43 which may be a lamp 44 or LED or any other visual or audible indicator to provide an indication of the transistor defect. In practice, the base emitter voltage of a malfunctioning transistor is only a few millivolts, while the base emitter voltage of a properly operating transistor is about 700 mV.

Further, a detection means for detecting if a pnp bipolar transistor is malfunctioning and an indicator device for indicating a malfunction of the pnp bipolar transistor may be provided where npn transistor 30 of FIG. 5A is replaced with pnp transistor 31 as shown in FIG. 5B. In that case, a detection means similar to that of detection means 40 of FIG. 6 is connected between the emitter and base of the pnp transistor; however, the polarity of the voltage generator 41 is reversed and a logic high level output from comparator 42 designates that the transistor is okay. Further, the failure of indicator device 43 to emit light indicates that the transistor is malfunctioning.

Figure 7:
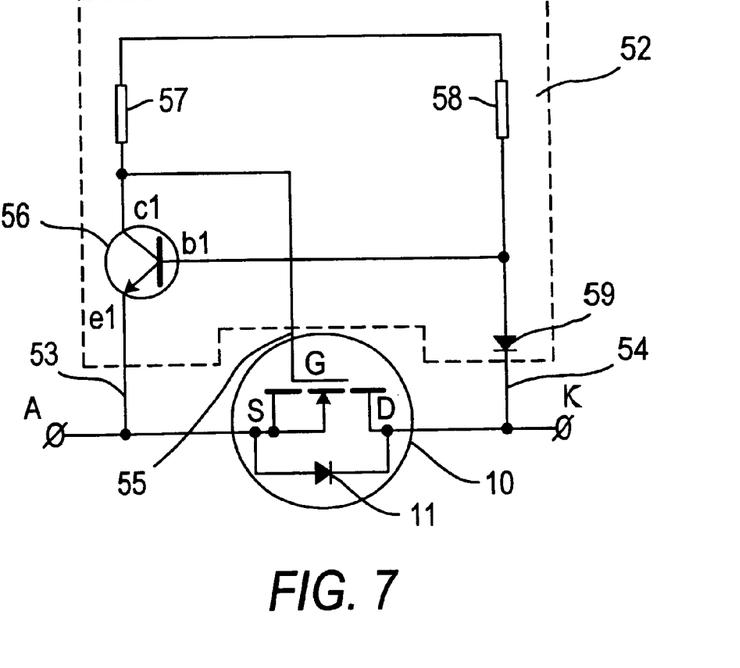
FIG. 7 is the circuit of FIG. 2 modified to employ an alternate voltage comparator in accordance with another embodiment of the invention.
Figure 8:
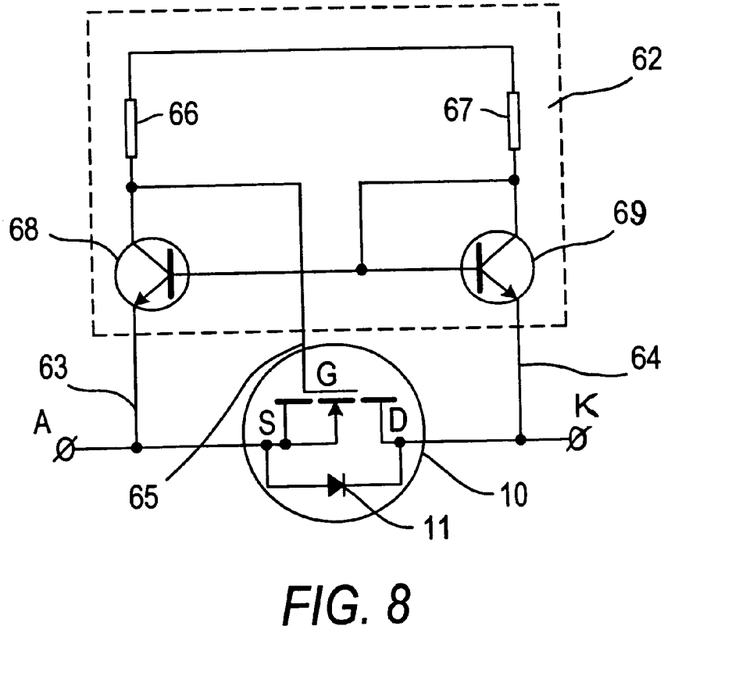
FIG. 8 is the circuit of FIG. 2 modified to employ another alternate voltage comparator in accordance with yet another embodiment of the invention.

FIGS. 7 and 8 show the circuit of FIG. 2 modified with alternate voltage comparators. In the previous embodiments of the invention, the voltage comparators 12, 22 and 32 are operational amplifiers. However, these voltage comparators may be replaced by voltage comparators 52 and 62 illustrated in FIGS. 7 and 8.

In FIG. 7, voltage comparator 52 has a positive input 53, a negative input 54, and an output 55. Voltage comparator 52 includes a bipolar transistor 56 with an emitter e1, a collector c1 and a base b1. Transistor 56 is illustrated as an npn bipolar transistor but the circuit may be modified to replace a pnp transistor for npn transistor 56. Voltage comparator 52 further includes series resistors 57 and 58 and actual diode 59. The emitter e1 of the bipolar transistor 56 is the positive input 53 of the voltage comparator 52. The collector c1 of the bipolar transistor 56 is the output 55 of the voltage comparator 52. Series resistors 57 and 58 are connected between the connector c1 and the base b1 of the bipolar transistor 56. The base b1 of the bipolar transistor 56 is further connected to an anode of diode 59 and a cathode of diode 59 is the negative input 54 of the voltage comparator 52. The diode 59 permits the use of voltages within the range of about 25 to 150 Volts across the diode and accordingly, the voltage comparator 52 may be employed in applications where even voltages in this range can occur between circuit elements composing the voltage comparator 52. Typically, however, the positive power supply rail voltages are in the range of 3.3 to 12 Volts.

FIG. 8 shows the circuit of FIG. 2 modified to include another alternative embodiment of the voltage comparator. In FIG. 8, the voltage comparator 12 of FIG. 2 has been replaced by voltage comparator 62. Voltage comparator 62 has a positive input 63, a negative input 64, and an output 65. The voltage comparator 62 includes two series resistors 66 and 67 and two transistors 68 and 69. Each transistor has an emitter, collector and base. Transistors 68 and 69 are illustrated as npn bipolar transistors. However, the circuit may be modified to replace pnp transistors for npn transistors 68 and 69.

As shown in FIG. 8, the emitter of transistor 68 is the positive input 63 of the voltage comparator 62. The emitter of transistor 69 is the negative input 64 of the voltage comparator 62. Resistors 66 and 67 are connected in series between the collectors of transistors 68 and 69. The collector of transistor 68 is the output 65 of the voltage comparator 62. The bases of transistors 68 and 69 are connected and shorted to the collector of transistor 69. Bipolar transistor 69 may withstand a voltage between the base and emitter of only about 5 volts. Accordingly, if this voltage is expected to exceed that level, the voltage comparator shown in FIG. 7 should be employed instead. Typically, when positive power supply rail voltages for the circuit are in the range of 3.3 to 12 Volts, the transistor 69 is adequate.

Figure 9:
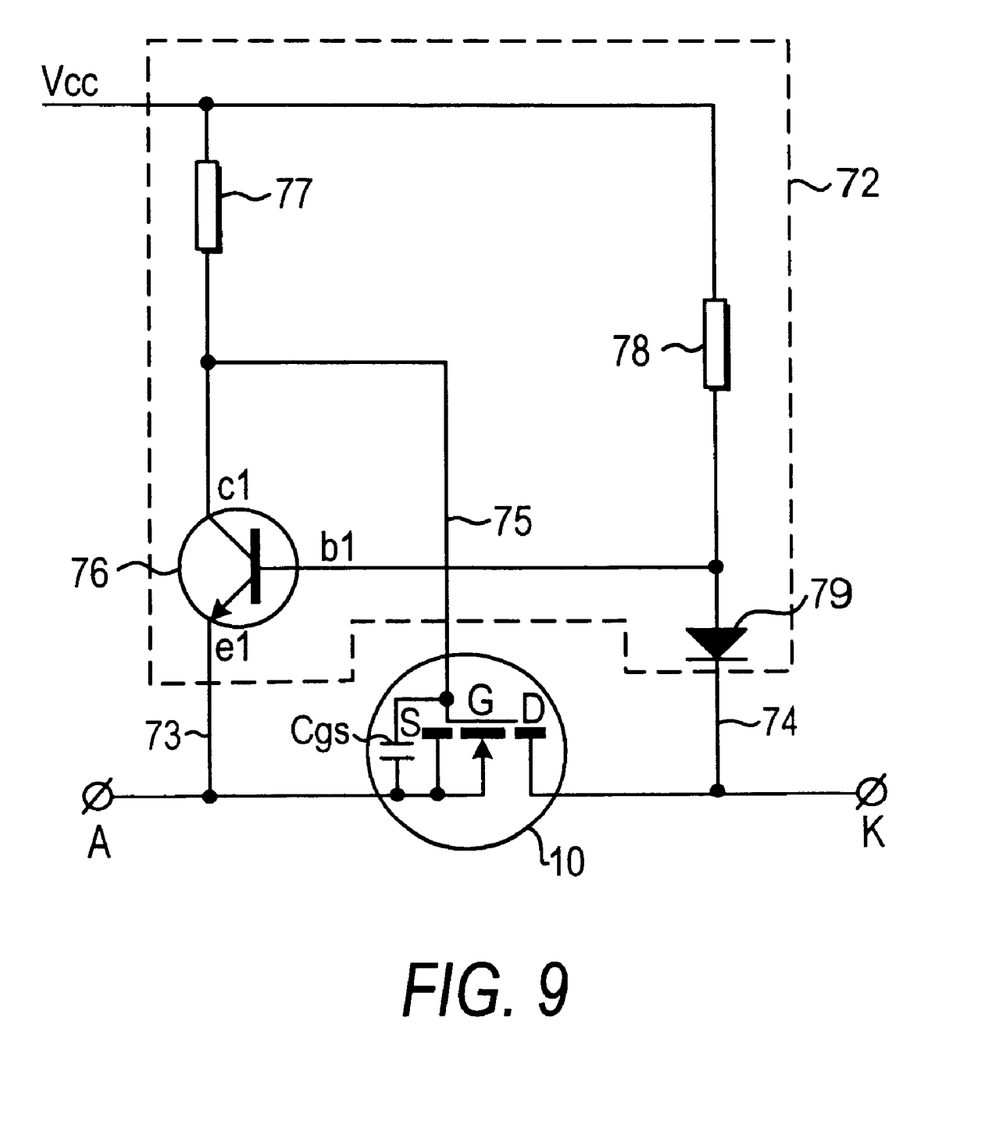
FIG. 9 is a circuit of the present invention similar to that of FIG. 7 and showing a MOSFET with an intrinsic internal capacitance.

FIG. 9 shows a circuit similar to FIG. 7 in which MOSFET 10 is illustrated having an integral capacitance Cgs. In FIG. 9, voltage comparator 72 has a positive input 73, a negative input 74, and an output 75. Voltage comparator 72 includes a bipolar transistor 76 with an emitter e1, a collector c1 and a base b1. Transistor 76 is illustrated as an npn bipolar transistor but the circuit may be modified to replace a pnp transistor for npn transistor 76. Voltage comparator 72 further includes resistors 77 and 78 each connected to the voltage Vcc and actual diode 79. The emitter e1 of the bipolar transistor 76 is the positive input 73 of the voltage comparator 72. The collector c1 of the bipolar transistor 76 is the output 75 of the voltage comparator 72. Resistors 77 and 78 are connected between the collector c1 and the base b1 of the bipolar transistor 76 to Vcc. The base b1 of the bipolar transistor 76 is further connected to an anode of diode 79 and a cathode of diode 79 is the negative input 74 of the voltage comparator 72.

In FIG. 9 the MOSFET 10 has a significant gate-source capacitance Cgs, for example up to a few thousand pF. When the anode A is at a lower voltage than the cathode K, transistor 76 is turned on and the gate-source capacitance Cgs discharges across the collector c1 and the emitter e1 of transistor 76. The MOSFET 10 then switches off. However, when the anode A is at a higher voltage than the cathode K, the transistor 76 will be off. Current flows from the voltage source Vcc through resistor 78 and diode 79 to the cathode K. The gate-source capacitance Cgs charges by current flowing from voltage source Vcc through resistor 77 to MOSFET 10. The MOSFET 10 then switches on. The switch-on time is limited by the time constant RC defined by the resistance of resistor 78 and the gate-source capacitance Cgs. Since the capacitance Cgs is significant, the switch-on time is also significant. The difference between the switch-off and switch-on time for the MOSFET 10 is dependent upon the current gain of transistor 76. For a transistor with a current gain of 100, the switch-on time of MOSFET 10 is 100 times greater than the switch-off time of MOSFET 10.

Figure 10:
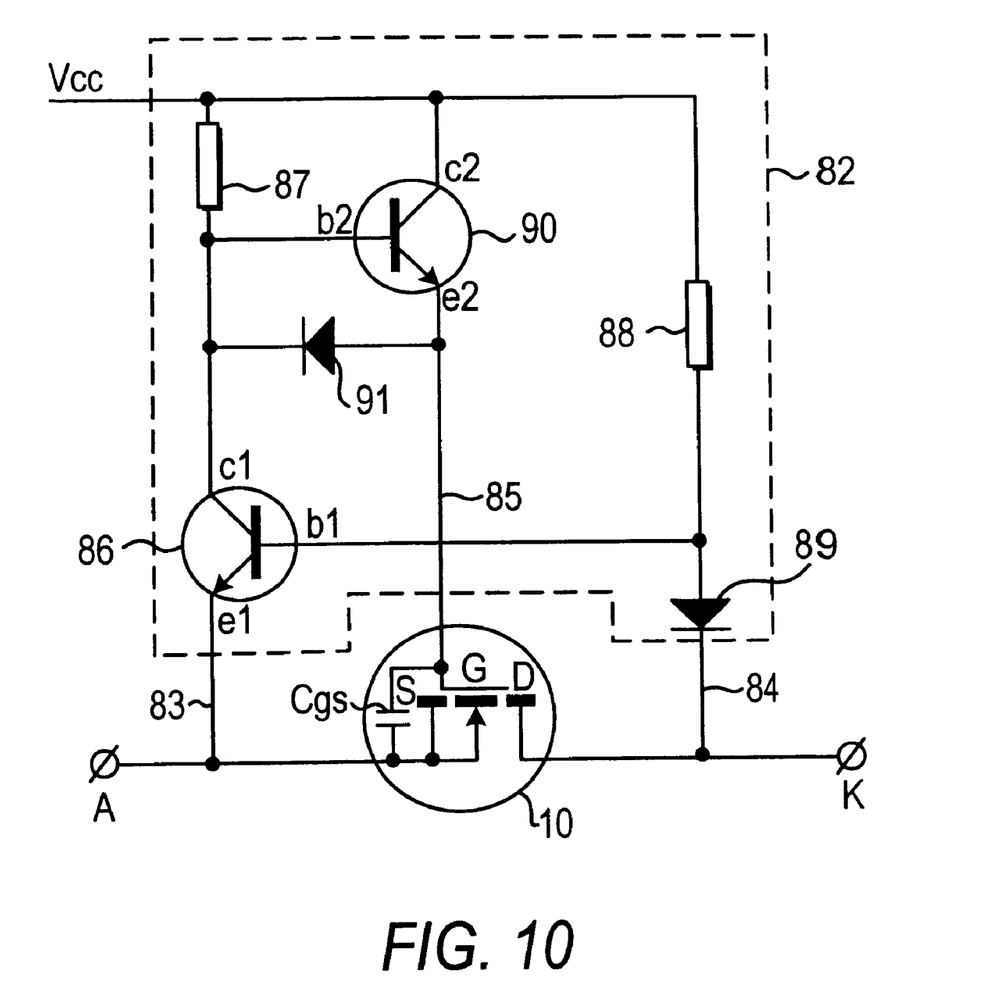
FIG. 10 is a circuit of the present invention similar to that of FIG. 9 and showing a charging transistor for the internal capacitor of the MOSFET.

FIG. 10 shows an embodiment of the invention in which the diode simulating circuit switches on as well as off at high speeds. The embodiment of FIG. 10 is for use in applications, such as a rectifier for switch-mode power supplies, where it is necessary for the diode simulating circuit to switch on as fast as it switches off, for example at speeds as high as a few hundred kilohertz. FIG. 10 shows MOSFET 10 having an integral capacitance Cgs. In FIG. 10, voltage comparator 82 has a positive input 83, a negative input 84, and an output 85. Voltage comparator 82 includes a first bipolar transistor 86 with an emitter e1, a collector c1 and a base b1. Transistor 86 is illustrated as an npn bipolar transistor but the circuit may be modified to replace a pnp transistor for npn transistor 86. Voltage comparator 82 further includes resistors 87 and 88 each connected to the voltage Vcc and actual diode 89. The emitter e1 of the first bipolar transistor 86 is the positive input 83 of the voltage comparator 82. The collector c1 of the bipolar transistor 86 is connected to the output 85 of the voltage comparator 82 through an actual diode 91. The anode of diode 91 is connected to the output 85 while the cathode of diode 91 is connected to the collector c1 of transistor 86. Resistor 87 is connected between the collector c1 of transistor 86 and the voltage Vcc. Resistor 88 is connected between voltage Vcc and an anode of diode 89. The base b1 of the bipolar transistor 86 is further connected to the anode of diode 89 and the cathode of diode 89 is the negative input 84 of the voltage comparator 82. FIG. 10 further shows second bipolar transistor 90 with an emitter e2, a collector c2 and a base b2. Transistor 90 is a charging transistor for the gate-source capacitance Cgs for MOSFET 10. The collector c2 of transistor 90 is connected to the voltage source Vcc. The emitter e2 of the transistor 90 is connected to the gate of MOSFET 10. The base b2 of transistor 90 is connected to the node between resistor 87 and the cathode of diode 91.

In FIG. 10, the MOSFET 10 also has a significant gate-source capacitance Cgs, for example up to a few thousand pF. When the anode A is at a lower voltage than the cathode K, transistor 86 is turned on and the gate-source capacitance Cgs discharges through diode 91 and across the collector c1 and the emitter e1 of transistor 86. The MOSFET 10 then switches off. However, when the anode A is at a higher voltage than the cathode K, the transistor 86 will be off. Current flows from the voltage source Vcc through resistor 87 to base b2 of charging transistor 90 and to collector c2 of transistor 90. Transistor 90 is turned on and subsequently amplified current flows to MOSFET 10, charging the integral capacitance Cgs switching the MOSFET 10 on. The switch-on time is dependent upon the current gain of the charging transistor 90. Although the capacitance Cgs is significant, its effect is reduced by the current amplification of the transistors 86 and 90. The capacitance Cgs is both charged and discharged through a transistor. The difference between the switch-off and switch-on time for the MOSFET 10 is thereby minimized.

The invention further contemplates a method of conducting current in one direction from a terminal A to a terminal K and blocking current in a second direction from a terminal K to a terminal A. In the method, an intrinsic diode of a three terminal switch is connected so that the effective anode of the intrinsic diode is connected to terminal A and the effective cathode of the intrinsic diode is connected to terminal K. Further, a voltage signal at a positive input of a comparator is compared to a voltage signal at a negative input of the comparator to obtain an output voltage. The output of the voltage comparator is connected to the control terminal of the three terminal switch and the voltage at the source of the three terminal switch is input to the positive input of the voltage comparator and the voltage at the drain of the three terminal switch is input to the negative input of the comparator.

A three terminal switch is employed which typically permits current to flow from a drain (or source) to a source (or drain) by connecting the drain (or source) to a higher voltage than the source (or drain). In the method of the invention, the drain (or source) which is typically connected to the higher voltage so that current is intended to flow from the drain (or source) to the source (or drain) is instead connected to the lower voltage so that the device is employed for conducting current from the source (or drain) to the drain (or source). Accordingly, a MOSFET device is connected to operate with the opposite polarity from the polarity with which a MOSFET device is traditionally intended to operate.

The invention contemplates connecting a switching means for switching current, such as any type of transistor (MOSFET or bipolar transistor), between two terminals A and K to conduct current from terminal A to terminal K and to block current from terminal K to terminal A where there is no significant threshold voltage for conducting between the two terminals connected to terminals A and K. There is an internal resistance associated with the switching means between the two terminals connected to terminals A and K. Further, conduction of the switching means is controlled by a control terminal of the switching means controlled by a device such as a voltage comparator that receives signals from terminals A and K. If the switching means has an intrinsic diode associated therewith, the anode of the diode is connected to terminal A and the cathode of the diode is connected to terminal K. The switching means permits the conduction of current from terminal A to terminal K when terminal A is at a higher voltage than terminal K and blocks current from terminal K to terminal A when the voltage at terminal K is at a higher voltage than the voltage at terminal A.

The method of the invention comprises comparing a voltage signal at a positive input of a comparator to a voltage signal at a negative input of the comparator to obtain an output voltage; (a) connecting a three terminal switch between terminal A and terminal K, wherein the three terminal switch has an internal resistance associated therewith, an intrinsic diode associated therewith, and a source for electrons, a drain for electrons and a control terminal; (b) connecting the output voltage to the control terminal of the three terminal switch; (c) connecting an effective anode of the intrinsic diode to terminal A; (d) connecting an effective cathode of the intrinsic diode to terminal K; and (e) inputting voltage signals to the comparator by connecting the source of the three terminal switch to the positive input of the comparator, and connecting the drain of the three terminal switch to the negative input of the comparator.

The invention further contemplates a method for improving the switching performance of a three terminal switch having a source for electrons, a drain for electrons, and a control terminal having an internal capacitance between the control terminal and the source for electrons comprising amplifying the current for modifying the charged state of the internal capacitance. The step of amplifying the current involves charging and discharging the internal capacitance.

Although the invention has been described with reference to the preferred embodiments, it will be apparent to one skilled in the art that variations and modifications are contemplated within the spirit and scope of the invention. For example, npn transistors may be replaced (with no or minor modifications to the circuit) with pnp transistors and vis versa and enhancement MOSFETs may be replaced by depletion MOSFETs and vis versa. Further, with minor modifications to the circuits, n-channel MOSFETs may be replaced by p-channel MOSFETs and vis versa.

Detection means may be employed for circuits using bipolar transistors as well as MOSFETs, depletion MOSFETs as well as enhancement MOSFETs, and p-channel MOSFETs as well as the n-channel MOSFETs. The various voltage comparators disclosed may be employed in any of the circuits of FIGS. 2, 3, 4, 5A and 5B and 6. Further, with minor modifications other switching means such as other types of transistors may be employed and it is considered to be within the skill of one of ordinary skill in the art to know that other switching means including other transistors are equivalent to the switching means disclosed herein. The drawings and description of the preferred embodiments are made by way of example rather than to limit the scope of the invention, and it is intended to cover within the spirit and scope of the invention all such changes and modifications.

I claim:

1. A circuit for improving switching performance of a three terminal switch comprising:

said three terminal switch having a source for electrons, a drain for electrons, and a control terminal having an internal capacitance between the control terminal and the source for electrons; and means for amplifying a current for modifying a charged state of said internal capacitance; wherein said means for amplifying the current comprises a transistor having an emitter, collector, and base; said modification of said charged state takes place across said collector and emitter; and said base controls said amplification of current in synchronisation with the switching of the three terminal switch; and wherein said means for amplifying the current further comprises a diode connected between the control terminal of the three terminal switch and the collector of the transistor.

2. A circuit according to claim 1 wherein said means for amplifying responds to voltages at the source and drain of the switch and establishes a switching time of said switch.

3. A circuit according to claim 1 wherein said means for amplifying the current comprises a transistor.

4. A circuit according to claim 3 wherein said transistor has an emitter, collector and base; said modification of said charged state takes place across said collector and emitter; and said base controls said amplification of current in synchronisation with the switching of the three terminal switch.

5. A circuit according to claim 1 wherein said means for amplifying the current amplifies a charging current and a discharging current alternately.

6. A circuit according to claim 5 wherein said means for amplifying the current comprises a first transistor for controlling charging and a second transistor for controlling discharging of said capacitance.

7. A method according to claim 1 wherein amplifying the current charges and discharges the internal capacitance.

8. A circuit with two terminals A and K, which conducts current in one direction from terminal A to terminal K and blocks current in an opposite direction from terminal K to terminal A, comprising:

a voltage comparator, having a positive input, a negative input, and an output; and a three terminal means for switching current with a source for electrons, a drain for electrons, and a control terminal controlled by a voltage from the output of said voltage comparator;

said three terminal switching means having an internal capacitance between the control terminal and the source for electrons associated therewith; and wherein said voltage comparator includes current amplification means that negate effects on switching time of the switching means due to said internal capacitance.

9. A circuit according to claim 8 wherein said current amplification means in order to negate the effects on switching time of the switching means due to said internal capacitance establishes a switching time in response to voltages at the source and drain of said switch.

10. A circuit according to claim 9 wherein said current amplification means consists of two transistors.

* * * * *